United States Patent
Le Bars (10) Patent No.: US 11,538,757 B2
(45) Date of Patent: Dec. 27, 2022

(54) INTEGRATED CIRCUIT WITH CIRCUIT CELLS HAVING LOWER INTERCELL ROUTING METAL LAYERS

(71) Applicant: QUALCOMM Incorporated, San Diego, CA (US)

(72) Inventor: Vincent Xavier Le Bars, Poway, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 302 days.

(21) Appl. No.: 16/667,067

(22) Filed: Oct. 29, 2019

(65) Prior Publication Data
US 2021/0125926 A1    Apr. 29, 2021

(51) Int. Cl.
*H01L 23/535* (2006.01)
*H01L 23/522* (2006.01)
*H01L 23/528* (2006.01)
*G06F 30/394* (2020.01)

(52) U.S. Cl.
CPC .......... *H01L 23/535* (2013.01); *G06F 30/394* (2020.01); *H01L 23/528* (2013.01); *H01L 23/5226* (2013.01); *H01L 23/5228* (2013.01)

(58) Field of Classification Search
CPC ............ H01L 23/535; H01L 23/5226; H01L 23/5228; H01L 23/528; G06F 30/394
See application file for complete search history.

(56) References Cited

U.S. PATENT DOCUMENTS

| | | | | |
|---|---|---|---|---|
| 5,399,517 A | * | 3/1995 | Ashtaputre | H01L 27/0207 257/211 |
| 5,990,502 A | * | 11/1999 | Park | H01L 27/11807 257/202 |
| 9,454,632 B1 | * | 9/2016 | Krishnamurthy | H01L 27/0207 |
| 9,978,682 B1 | * | 5/2018 | Correale, Jr. | H01L 27/11807 |
| 2016/0188777 A1 | * | 6/2016 | Bisht | G06F 30/392 716/131 |
| 2017/0358565 A1 | * | 12/2017 | Hensel | H01L 27/11807 |
| 2018/0253523 A1 | * | 9/2018 | Pelloie | G06F 30/394 |

\* cited by examiner

*Primary Examiner* — Shahed Ahmed
*Assistant Examiner* — Vicki B. Booker
(74) *Attorney, Agent, or Firm* — Loza & Loza, LLP (57) ABSTRACT

An integrated circuit (IC) including an IC cell arranged in a row of IC cells, wherein the IC cells in the row have substantially the same height, wherein the IC cell includes a portion of an intercell metal interconnect terminating at the IC cell at a metal layer or extending entirely through the IC cell on the metal layer and electrically connecting together a pair of nodes of a pair of IC cells, respectively.

25 Claims, 6 Drawing Sheets

INTEGRATED CIRCUIT WITH CIRCUIT CELLS HAVING LOWER INTERCELL ROUTING METAL LAYERS

FIELD

Aspects of the present disclosure relate generally to integrated circuits, and in particular, to an integrated circuit with circuit cells having lower intercell routing metal layers.

DESCRIPTION OF RELATED ART

Metal pins or nodes (e.g., input/output (I/O)) of different circuit cells of an integrated circuit (IC) are typically electrically connected to each other using higher metal layers (e.g., metal layer M3 or higher) of a set of stacked metallization layers (e.g., M1 to MN, from M1 being the lowest metal layer closest to the silicon substrate of the IC to MN being the highest metal layer). The electrical connection of the metal pins of different circuit cells goes by way of a set of metal vias and a set of intermediate metal layers.

Metal vias are typically the higher-resistive portions of the electrical connections between metal pins of different cells. As such, the metal vias have adverse or undesirable effects on performance, power consumption, and IC footprint. For example, metal vias contribute significant signal or clock delays between metal pins; thereby, limiting or reducing the maximum operating frequency of the associated circuitry, and potentially causing signal or clock timing issues. The high-resistivity characteristics of metal vias produce IR losses leading to potential higher power consumption. Additionally, with regard to IC footprint, the use of higher metallization layers by way of metal vias for intercell routing produce routing congestion, often requiring larger IC footprint to alleviate the congestion and reduce signal crosstalk.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an integrated circuit (IC) including a first IC cell arranged in a first row of IC cells, wherein the IC cells in the first row have substantially the same height, wherein the first IC cell includes a first portion of a first intercell metal interconnect terminating at the first IC cell at a first metal layer or extending through the first IC cell entirely on the first metal layer and electrically connecting together a first pair of nodes of a first pair of IC cells in the first row, respectively.

Another aspect of the disclosure relates to an integrated circuit (IC) including a first IC cell arranged in a first row with and between a first pair of IC cells, wherein the first IC cell and the first pair of IC cells have a first height, wherein the first IC cell includes a first portion of a first intercell metal interconnect extending entirely on a first metal layer and electrically connecting together a first pair of nodes of the first pair of IC cells, respectively. The integrated circuit further includes a second IC cell arranged in a second row with and between a second pair of IC cells, wherein the second IC cell and the second pair of IC cells have a second height, wherein the second IC cell includes a second portion of a second intercell metal interconnect extending entirely on the first metal layer or a second metal layer and electrically connecting together a second pair of nodes of the second pair of IC cells, respectively.

Another aspect of the disclosure relates to an integrated circuit (IC) including a set of rows of IC cells, wherein at least one IC cell in at least one row includes a portion of an intercell metal interconnect extending entirely on a metal layer and electrically connecting together a pair of nodes of a pair of IC cells in the same row, respectively.

Another aspect of the disclosure relates to a method of designing an integrated circuit. The method includes forming at least one integrated circuit (IC) cell including a through reserved track on a metal layer; instantiating a row of IC cells including the at least one IC cell; and forming an intercell metal interconnect on the through reserved track through the at least one IC cell, wherein the intercell metal interconnect electrically couples a pair of nodes of two of the instantiated IC cells, respectively.

Another aspect of the disclosure relates to an integrated circuit (IC) cell. The IC cell includes circuitry for processing at least one input signal to generate at least one output signal; and a routing channel reserved for routing a signal through the IC cell or to or from another IC cell.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Standard integrated circuit (IC) cells are the building blocks of any digital IC ("chip") or system-on-chip (SOC). The way the standard cells are presented to a place and route (PR) tool is through an abstracted representation called an abstract view or library exchange format (LEF) (e.g., LEF is an industry standard for abstracted cell layout). The abstract view includes pin locations and metal types, as well as metal and via keep-outs, called obstructions.

The PR tool has to route metal interconnects and vias to cell metal pins and avoid obstructions. The obstructions are used to block the PR tool from generating metal routing where metal interconnects and vias are used inside the standard cell. As part of the place and route (PR) process, the standard cells are assigned locations inside existing place holders called standard cell rows. The height of a standard cell is usually the height of one row, but may also be a multiple of one row (e.g., double-row-height cell, triple-row-height cell, etc.). After the PR standard cells placement step, including assigning locations for each cell, the tool adds physical connections between the cells using metal interconnects and vias; this PR step is called routing.

The design of standard cells has been very similar for the past several years, basically driven by height reduction, routability, and reduce power consumption. The improvements in terms of performance (e.g., maximum operating frequency), IC area, and power consumption have been mainly achieved due to both improvement in devices inside the cell, such as field effect transistors (FETs) (e.g., n-channel metal oxide (NMOS) FETs, p-channel metal oxide (PMOS) FETs, FINFETs, etc.), and design rules from IC foundries allowing for smaller dimensions in metal layers and vias.

The main trend in the relevant field has been to design standard cells as compact as possible, packing the active devices, the internal metal bridges between connectors and metal pins into the smallest possible area, while allowing metal pins to be accessible by automated routers. It results in standard cell layouts where the lowest metal layer available for automated routing is heavily utilized.

As a result, the lowest metal layers available for automated routing (e.g., M1, where "1" or the number after "M" indicates the metal layer above the silicon substrate of the IC) is almost unusable by a place and route (PR) tool, forcing intercell routing to use extensively high-resistive metal layers, such as metal layers M3 or higher, either to directly perform the connection or as a bridge on the way to upper metal layers. It shall be understood that local interconnects may be situated between metal layer M1 and the substrate (e.g., silicon substrate). The above concepts are now explained with reference to the following specific examples.

Figure 1:
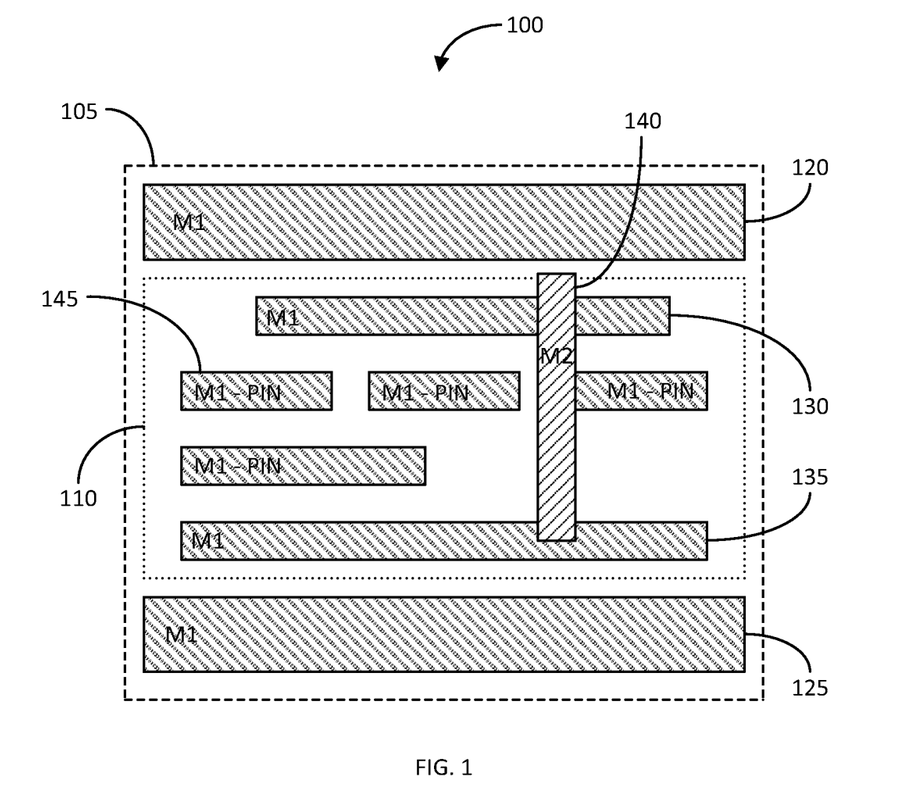
FIG. 1 illustrates a top view of an exemplary integrated circuit (IC) cell in accordance with an aspect of the disclosure.

FIG. 1 illustrates a top view of an exemplary integrated circuit (IC) cell 100 in accordance with an aspect of the disclosure. In this example, the IC cell 100 is a single-row-height cell with a boundary 105 having a height (vertical dimension as shown) of a single row and width (horizontal dimension as shown) as desired per the functional requirements of the cell. The IC cell 100 includes a pair of power or voltage metallization rails 120 and 125 (e.g., Vdd and ground) near the top and bottom of the cell, and formed in, for example, metallization layer M1. The IC cell 100 further includes multiple active regions 110 (e.g., P- and N-doped diffusion regions separated by shallow trench isolation (STI), for example, in the case of FINFETs), formed within and/or upon a substrate (e.g., a silicon substrate), and situated between the power rails 120 and 125. One or more devices, such as the FETs discussed above, are implemented in and upon the active or diffusion region 110, and receive power (e.g., voltage and current) via the power rails 120 and 125.

The circuit cell 100 further includes various intracell metal interconnects 130 and 135 implemented in metallization layer M1 for making direct electrical contact to terminals (e.g., drain(s), source(s), and/or gate(s)) of one or more devices (e.g., FETs) of the cell 100, and an intracell metal bridge 140 for making electrical contacts to the metal interconnects 130 and 135. The IC cell 100 further includes a set of one or more metal pins or I/O nodes 145 (e.g., four (4), in this example). The width, spacing between, and other parameters of the features of the IC cell 100 (e.g., rails 120 and 125, intracell metal interconnect 130, 135, and 140, metal pins 345, etc.) are typically dictated by design rule checks (DRC) of the foundry manufacturing the IC.

The metal pins 145 are typically implemented in metallization layer M1, as they typically make direct electrical contact to the devices of the cell 100. For example, if the IC cell 100 performs the function of a three-input logic gate, three (3) of the metal pins 145 serve as the inputs to the logic gate, and one of the metal pins 145 serve as the output of the logic gate. Intercell metal interconnects (from cell to cell) is performed by a PR tool by routing metal interconnects between metal pins of one cell to metal pins of another cell. Thus, in this example, the PR tool routes intercell metal interconnects from other one or more cells to the metal pins 145 of the IC cell 100. The intercell metal interconnects are configured to route data signals between cells. This is better explained below with reference to another example.

Figure 2A:
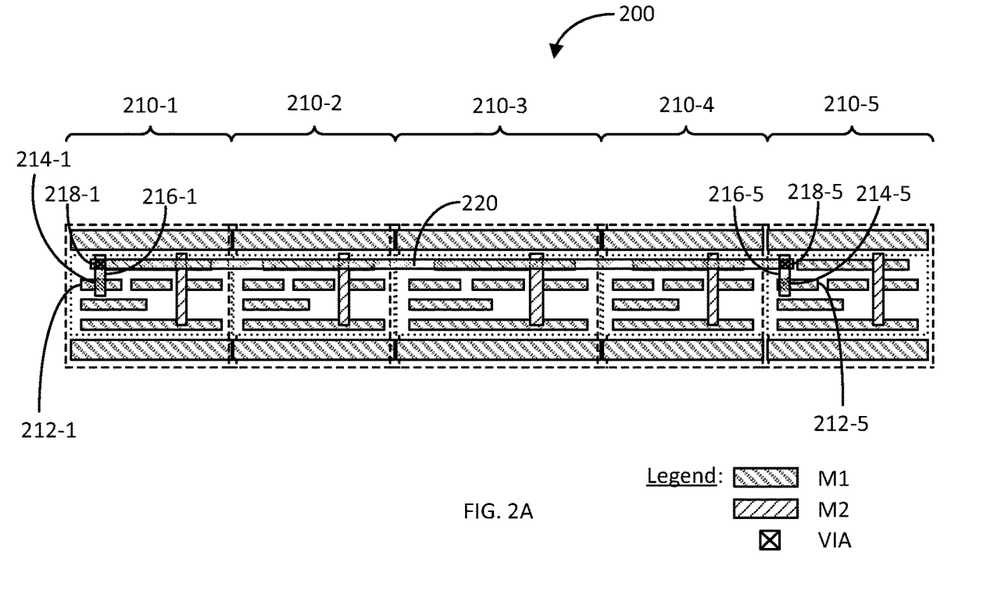
FIGS. 2A-2B illustrate top and side views of an exemplary integrated circuit (IC) including a row of IC cells in accordance with another aspect of the disclosure.
Figure 2B:
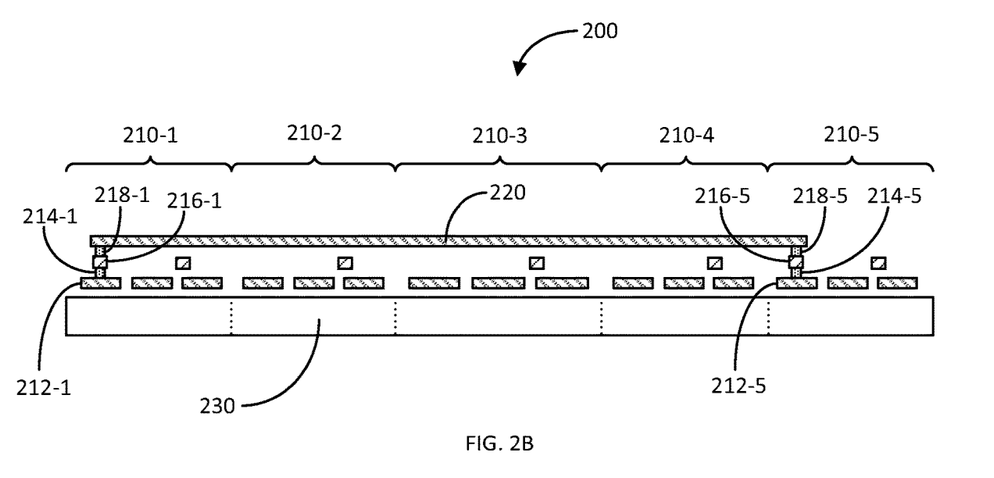

FIGS. 2A-2B illustrate top and side views of an exemplary integrated circuit (IC) including a row of IC cells 200 in accordance with another aspect of the disclosure. In this example, the row 200 includes five (5) IC cells 210-1 to 210-5 chained or abutted next to each other to, for example, form continuous upper and lower power rails and continuous active or diffusion regions extending longitudinally along the row. Each of the IC cells 210-1 to 210-5 may be configured to perform the same or completely different operation/function.

In this example, the cell 210-1 includes a metal pin 212-1 electrically connected to a metal pin 212-5 of the cell 210-5 over a silicon substrate 230 of the IC. As discussed above, since the trend is to make IC cells as compact as possible, it may not be possible for a PR tool to electrically connect metal pin 212-1 of cell 210-1 to metal pin 212-5 of cell 210-5 via only lower metallization layer, such as metal layer M1 and/or metal layer M2. For instance, in this example, the PR tool has generated an intracell metal interconnect having a first metal via 214-1 between M1 and M2 metal layers, a metal bridge 216-1 on metal layer M2, a second metal via 218-1 between M2 and M3 metal layers, all within cell 210-1; an intercell metal interconnect 220 along metal layer M3 extending from cell 210-1 to cell 210-5; and a third metal via 218-5 between M3 and M2 metal layers, a metal bridge 216-5 in metal layer M2, and a fourth metal via 214-5 between M2 and M1 metal layers.

Thus, the electrical connection between metal pin 212-1 of IC cell 210-1 to metal pin 212-5 of IC cell 210-5 is by way of four (4) metal vias. Metal vias are generally high-resistive sections of the electrical connection. These high-resistive metal vias typically have adverse impact on circuit performance in terms of maximum operating frequency, timing, power consumption, IC area, and others. For example, the high-resistive metal vias increase signal or clock delay between the metal pins 212-1 to 212-5, which may adversely impact the maximum operating frequency and timing. The metal vias also produce IR losses; thereby, increasing the power consumption of the IC. Moreover, the metal interconnects occupying higher metallization layers, such as metal layer M3 in this example, or even higher, generates routing congestion in those higher layers; resulting in requiring additional IC area to implement the needed routing. There is also the negative impact of signal crosstalk due to routing congestion.

Figure 3:
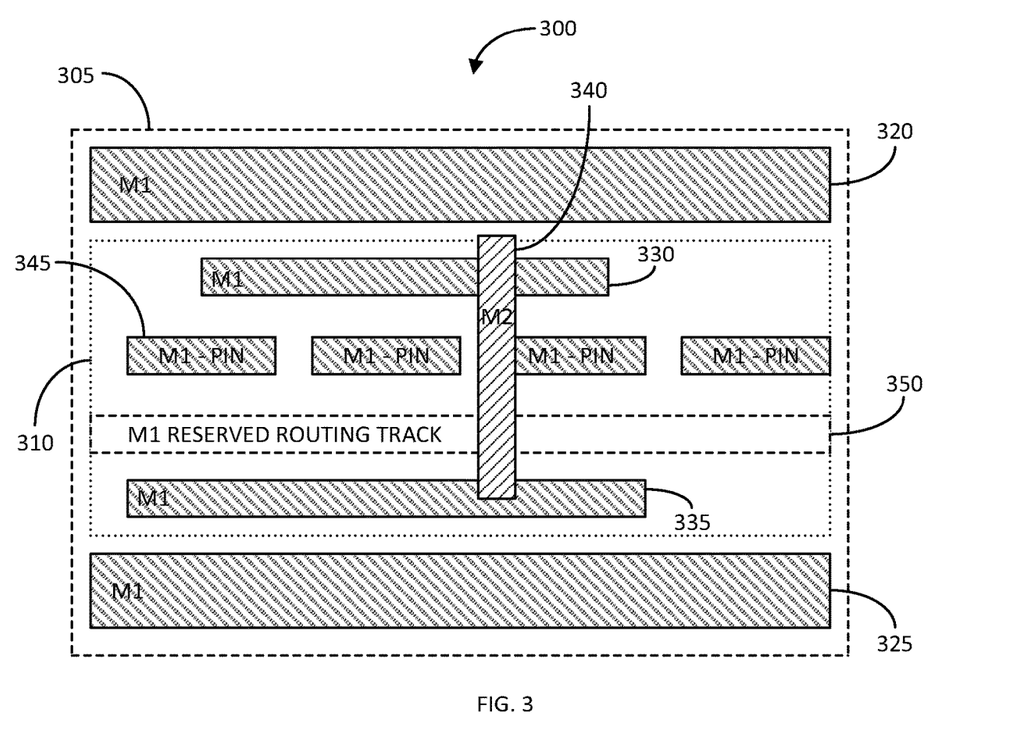
FIG. 3 illustrates a top view of another exemplary integrated circuit (IC) cell in accordance with another aspect of the disclosure.

FIG. 3 illustrates a top view of another exemplary IC cell 300 in accordance with another aspect of the disclosure. In summary, the IC cell 300 is reconfigured, as compared to IC cell 100, to provide one or more routing tracks or channels through the IC cell 300 in a lower metal layer, such as M1 or M2 (or, generally, metal layers used to make direct connection to cell or other types of intracell metal connections, such as metal bridges). The one or more routing tracks or channels allow a PR tool to generate one or more (signal routing) intracell metal interconnects extending within the routing channel and electrically coupled to at least one metal pin or circuitry of the IC cell or extending through the routing channel to facilitate electrical connections of metal pins or circuitry of two other IC cells. In this particular example, the IC cell 300 is reconfigured to provide a through reserved routing track or channel on metal layer M1 extending from the left-end to the right-end of the boundary of the cell.

More specifically, the IC cell 300 includes a boundary 305 having a single-row-height (vertical dimension as shown), and the width (horizontal dimension as shown) larger compared to the width of IC cell 100. The larger width of IC cell 300 allows for all four (4) metal pins 345 of the cell positioned along the same horizontal section or track of the cell. In contrast, IC cell 100 has three (3) metal pins 145 in the same horizontal track, and another metal pin 145 in a different horizontal track. The horizontal aligning of all the metal pins 345, in this example, frees up a horizontal track so that the IC cell 300 includes an M1 reserved routing track or channel 350 extending from the left-end to the right-end of the boundary 305 of the cell 300.

The remaining components (e.g., configured to implement circuitry for processing at least one signal to generate at least one output signal) of the IC cell 300 is similar to that of IC cell 100. For example, the IC cell 300 includes a pair of power or voltage metallization rails 320 and 325 situated respectively near the top and bottom of the cell, and extending horizontally along the entire width of the cell. The IC cell 300 further include one or more intracell metal interconnects 330 and 335 in metal layer M1 to make direct electrical connection to terminals of one or more devices of the IC cell formed within and upon an active or diffusion region 310. The active or diffusion regions 310 also extend the entire width of the IC cell, and is situated between the power rails 320 and 325 to facilitate the one or more devices receiving power from the rails. Additionally, the IC cell 300 includes one or more metal bridges 340 formed in metal layer M2 for making the required intracell electrical connections for the cell.

Figure 4:
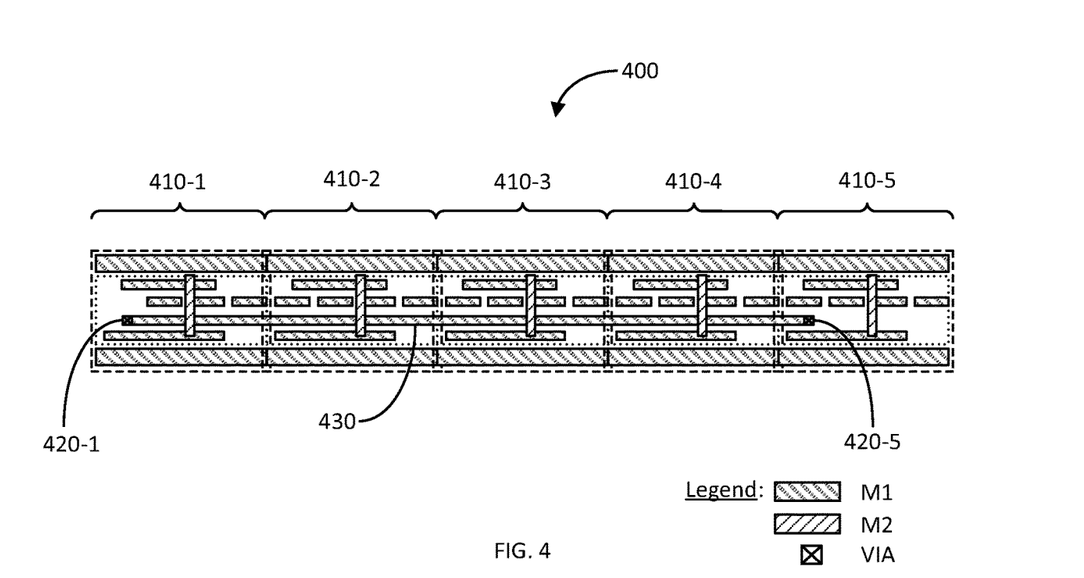
FIG. 4 illustrates a top view of another exemplary integrated circuit (IC) including a row of IC cells in accordance with another aspect of the disclosure.

FIG. 4 illustrates a top view of another exemplary integrated circuit (IC) including a row of IC cells 400 in accordance with another aspect of the disclosure. In this example, the row 400 includes five (5) IC cells 410-1 to 410-5 chained or abutted next to each other to, for example, form continuous upper and lower power rails and a continuous active or diffusion region extending longitudinally along the row. Each of the IC cells 410-1 to 410-5 may be configured to perform the same or completely different operation/function.

Each of the IC cells 410-1 to 410-5 may be configured similar to IC cell 300 by including an M1 reserved routing track through the cell. When the IC cells 410-1 to 410-5 are chained or abutted next to each other, an M1 routing can be formed from cell 410-1 to cell 410-5 in the reserved routing track. A PR tool may use the M1 reserved routing track to route between metal pins of IC cells within the same row.

For example, if an electrical connection is needed between a metal pin 420-1 of IC cell 410-1 and a metal pin 420-5 of IC cell 410-5, the PR tool may use the continuous M1 reserved routing track or channel having substantially the same height across the row of IC cells 410-1 to 410-5 to include or provide an intercell metal interconnect 430 entirely on the M1 layer (e.g., in a straight line) to electrically connect the metal pin 420-1 to metal pin 420-5. Note that the intercell metal interconnect 430 extends through IC cells 410-2 to 410-4 without making electrical contact to any device in these cells; that is, these cells 410-2 to 410-4 merely provide a track reserved on metallization layer M1 to facilitate the electrical connection between metal pins of other cells in the same row. The intercell metal interconnect 430 is configured to route a data signal between the metal pins 420-1 and 420-5.

Compared to the electrical connection between metal pins 212-1 and 212-5 of row 200, the electrical connection between metal pins 420-1 and 420-5 is along a single metallization interconnect along metal layer M1, and does not involve any metal vias. Whereas the electrical connection between metal pins 212-1 and 212-5 involves four (4) metal vias, which significantly increase the resistance between the metal pins 212-1 and 212-5. As a result, the electrical routing between metal pins 410-1 and 420-5 is much simpler, has significantly less resistance, and has much less signal delay. Accordingly, maximum operating frequency and timing are less impacted, power consumption is less as there are less IR losses, less IC area is needed because metal layer M3 or above is not needed to effectuate the electrical connection, and there is potentially less signal crosstalk because there is less routing congestion.

Figure 5:
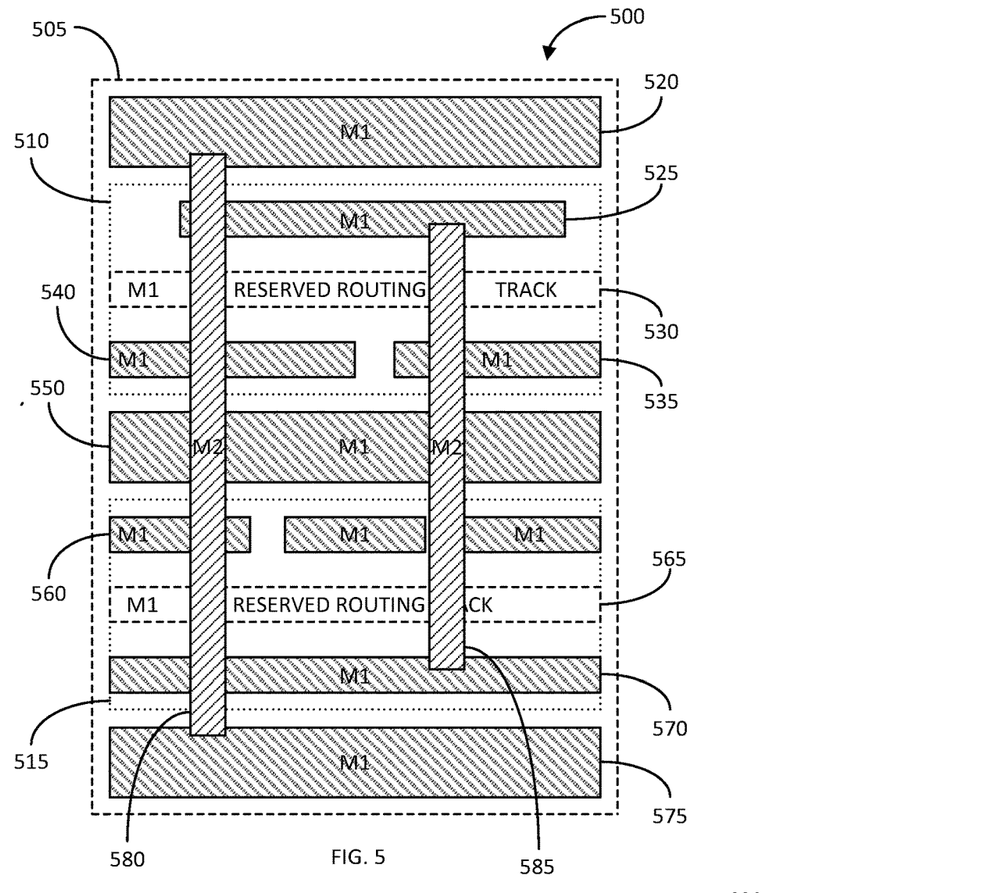
FIG. 5 illustrates a top view of another exemplary integrated circuit (IC) cell in accordance with another aspect of the disclosure.

FIG. 5 illustrates a top view of another exemplary IC cell 500 in accordance with another aspect of the disclosure. In IC cell 300, the cell width was made larger to place all of the metal pins 345 along the same horizontal track to free up a horizontal track to provide the M1 reserved routing track or channel 350. In IC cell 500, the cell height is made to be two-row-height so that the cell provides two M1 reserved routing tracks or channels. It shall be understood that an IC cell described herein may be configured to provide one or more reserved routing tracks or channels along metallization layers reserved for signal routing intracell connection for the cell.

In particular, the IC cell 500 includes a boundary 505 that has a two-row-height (vertical dimension as shown) and a width (horizontal dimension as shown) as needed to effectuate the function of the cell. The IC cell 500 includes circuitry for processing at least one signal to generate at least one output signal. In this regard, the IC cell 500 includes upper, middle, and lower power or voltage metallization rails 520, 550, and 575 formed in metal layer M1. The IC cell 500 includes multiple active/diffusion regions 510 in which and upon one or more devices (e.g., FETs) may be formed. The upper active or diffusion region 510 is situated between the upper and middle power rails 520 and 550, and extends from the left-end to the right-end of the boundary 550 of the cell. Similarly, the IC cell 500 includes a lower active or diffusion region 515 in which and upon one or more devices (e.g., FETs) may be formed. The lower active or diffusion region 515 is situated between the middle and lower power rails 550 and 575, and also extends from the left-end to the right-end of the boundary 505 of the cell. The IC cell 500 includes intracell metal interconnects 525, 535, 540, and 560 in metal layer M1 for making direct electrical connection to terminals of one or more devices of the IC cell 500. The IC cell 500 includes intracell metal bridges 580 and 585 formed in metal layer M2 for making electrical contacts to the power rails 520 and 580 and intracell metal interconnects 525 and 570 of the cell.

The IC cell 500 includes two (2) M1 reserved routing tracks or channels 530 and 565 extending horizontally from the left-end to the right-end of the boundary 505 (i.e., the entire width) of the cell 500. As discussed with reference to IC cell 300, a PR tool may use the two (2) M1 through reserved routing tracks or channels 530 and 565 to generate (signal routing) intercell metal interconnects to at least one metal pin or circuitry of the IC cell or between two pairs of metal pins or circuitry of other IC cells in the same row as IC cell 500, as exemplified in more detail below.

Figure 6:
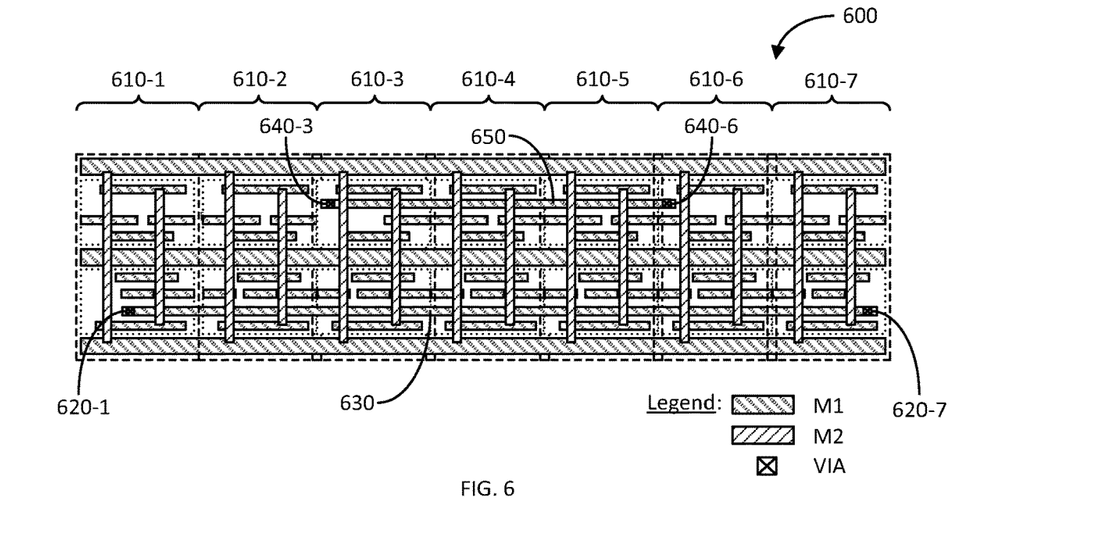
FIG. 6 illustrates a top view of another exemplary integrated circuit (IC) including a row of IC cells in accordance with another aspect of the disclosure.

FIG. 6 illustrates a top view of another exemplary integrated circuit (IC) including a row of IC cells 600 in accordance with another aspect of the disclosure. In this example, the row 600 includes seven (7) cells 610-1 to 610-7 chained or abutted next to each other to, for example, form continuous upper, middle, lower power rails and continuous upper and lower active or diffusion regions extending longitudinally along the row. Each of the IC cells 610-1 to 610-7 may be configured to perform the same or completely different operation/function.

Each of the IC cells 610-1 to 610-7 may be configured similar to IC cell 500 by including a pair of separate M1 reserved routing tracks. When the IC cells 640-1 to 610-7 are chained or abutted next to each other, the M1 through reserved routing tracks form two (2) continuous M1 reserved routing track from cell 610-1 to cell 610-7 by way of cells 610-2 to 610-6. A PR tool may use the continuous M1 reserved routing tracks to route between metal pins of IC cells within the same row.

For example, if an electrical connection is needed between a metal pin or I/O node 620-1 of IC cell 610-1 and a metal pin or I/O node 620-7 of IC cell 610-7, the PR tool may use the lower continuous M1 reserved routing track or channel having substantially the same height across the row of IC cells 610-1 to 610-7 to include or provide an intercell metal interconnect 630 entirely on the M1 layer (e.g., in a straight line) to electrically connect the metal pin 610-1 to metal pin 620-7. Note that the intercell metal interconnect 630 extends through IC cells 610-2 to 610-6 without making electrical contact to any device in these cells; that is, these cells 610-2 to 610-6 merely provide a track through which the intercell metal interconnect 630 extends for effectuating the electrical connection between metal pins of other IC cells in the same row. For example, the intercell metal interconnect 630 is configured to route a data signal between the metal pins 620-1 and 620-7.

Similarly, if an electrical connection is needed between a metal pin or I/O node 640-3 of IC cell 610-3 and a metal pin or I/O node 640-6 of IC cell 610-6, the PR tool may use the upper continuous M1 reserved routing track or channel having substantially the same height across the row of IC cells 610-1 to 610-7 to include or provide an intercell metal interconnect 650 entirely along the M1 layer (e.g., in a straight line) to electrically connect the metal pin 640-3 to metal pin 640-6. Note that the intercell metal interconnect 650 extends through IC cells 610-4 and 610-5 without making electrical contact to any device in these cells; that is, these cells 610-4 to 610-5 merely provide a track through which intercell metal interconnect 650 extends for effectuating the electrical connection between metal pins of other IC cells in the same row. For example, the intercell metal interconnect 650 is configured to route a data signal between the metal pins 640-3 and 640-6. Also note that IC cells 610-1 and 610-7 have unused (no metal interconnect) M1 reserved routing tracks or channels, as they are not needed in this example. These unused M1 routing tracks or channels are longitudinally (horizontally) aligned with the intercell metal interconnect 650.

Figure 7:
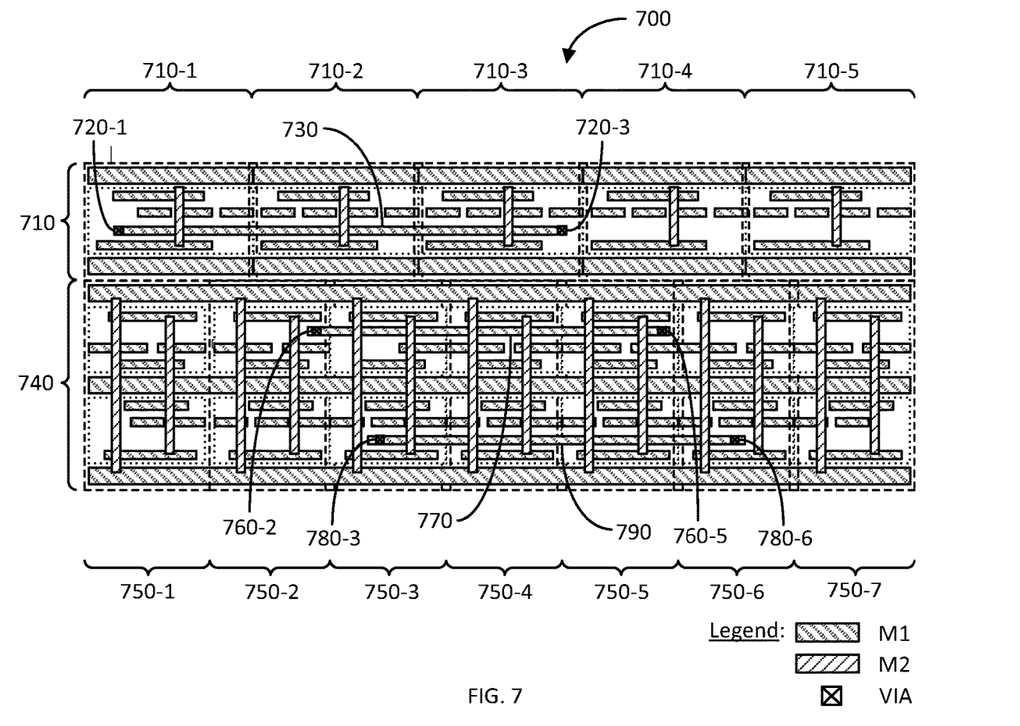
FIG. 7 illustrates a top view of another exemplary integrated circuit (IC) including two-rows of IC cells in accordance with another aspect of the disclosure.

FIG. 7 illustrates a top view of an integrated circuit (IC) 700 including a two-row array of IC cells 710 and 740 in accordance with another aspect of the disclosure. The first or upper row of cells 710 are of a single-row-height, and there are five (5) cells 710-1 to 710-5 in row 710. The second or lower row of cells 740 are of a double-row-height, and there are seven (7) cells 750-1 to 750-7 in row 740.

In this example, the five (5) cells 710-1 to 710-5 in the first row 710 are chained or abutted next to each other to, for example, form continuous upper and lower power rails and a continuous active or diffusion region extending longitudinally along the row. One of more of the IC cells 710-1 to 710-5 may be configured to perform essentially the same operation (e.g., a three-input logic AND operation), and/or one of more of the IC cells 710-1 to 710-5 may be configured to perform one or more different operations (e.g., an inverter, buffer, two-input logic OR operation, etc.).

Each of the IC cells 710-1 to 710-5 may be configured similar to IC cell 300 by including an M1 reserved routing track along substantially the same horizontal section or track of the cell. When the IC cells 710-1 to 710-5 are chained or abutted next to each other, the M1 reserved routing tracks form a continuous M1 reserved routing track from cell 710-1 to cell 710-5 by way of cells 710-2 to 710-4. A PR tool may use the M1 reserved routing track to route between metal pins of IC cells within the same row.

For example, if an electrical connection is needed between a metal pin or I/O node 720-1 of IC cell 710-1 and a metal pin or I/O node 720-3 of IC cell 710-3, the PR tool may use the continuous M1 reserved routing track or channel having substantially the same height across the row of IC cells 710 to include or provide an intercell metal interconnect 730 entirely along the M1 layer (e.g., in a straight line) to electrically connect the metal pin 720-1 to metal pin 720-3. Note that the intercell metal interconnect 730 extends through IC cell 710-2 without making electrical contact to any device in this cell; that is, this cell 710-2 merely provide a track through which the intercell metal interconnect 730 facilitates the electrical connection of metal pins of other IC cells in the same row. For example, the intercell metal interconnect 730 is configured to route a data signal between the metal pins 720-1 and 720-3. Note that, in this example, the M1 reserved routing tracks or channels in IC cells 710-4 and 710-5 are unused or empty on the M1 metal layer (i.e., do not include metallization) as they are not needed; yet the unused tracks or channels are longitudinally (horizontally) aligned with the intercell metal interconnect 730.

With regard to the second row 740, the seven (7) cells 750-1 to 750-7 are chained or abutted next to each other to, for example, form continuous upper, middle, lower power rails and continuous upper and lower active or diffusion regions extending longitudinally along the row. One of more of the IC cells 750-1 to 750-7 may be configured to perform essentially the same operation (e.g., a three-input logic AND operation), and/or one of more of the IC cells 750-1 to 750-7 may be configured to perform one or more different operations (e.g., an inverter, buffer, two-input logic OR operation, etc.).

Each of the IC cells 750-1 to 750-7 may be configured similar to IC cell 500 by including a pair of separate M1 reserved routing tracks. When the IC cells 750-1 to 750-7 are chained or abutted next to each other, the M1 reserved routing tracks form two (2) continuous M1 reserved routing tracks from cell 750-1 to cell 750-7 through cells 750-2 to 750-6. A PR tool may use the M1 reserved routing tracks to route between metal pins of IC cells within the same row.

For example, if an electrical connection is needed between a metal pin or I/O node 760-2 of IC cell 750-2 and a metal pin or I/O node 760-5 of IC cell 750-5, the PR tool may use the upper continuous M1 reserved routing track or channel having substantially the same height across the row of IC cells 740 to include or provide an intercell metal interconnect 770 entirely on the M1 metallization layer to electrically connect the metal pin 760-2 to metal pin 760-5. Note that the intercell metal interconnect 770 extends through IC cells 750-3 and 750-4 without making electrical contact to any device in these cells; that is, these cells 750-3 and 750-4 merely provide a track through which the intercell metal interconnect 770 extends for effectuating the electrical connection between metal pins of other IC cells in the same row. For example, the intercell metal interconnect 770 is configured to route a data signal between the metal pins 760-2 and 760-5. Note that IC cells 750-1, 750-6, and 750-7 have unused upper M1 reserved routing tracks or channels, as they are not needed in this example. These unused upper M1 reserved routing tracks or channels are longitudinally (horizontally) aligned with the intercell metal interconnect 770.

Similarly, if an electrical connection is needed between a metal pin or I/O node 780-3 of IC cell 750-3 and a metal pin or I/O node 780-6 of IC cell 750-6, the PR tool may use the lower continuous M1 reserved routing track or channel having substantially the same height across the row of IC cells 740 to include or provide an intercell metal interconnect 790 along the M1 layer (e.g., in a straight line) to electrically connect the metal pin 780-3 to metal pin 780-6. Note that the interconnect metal interconnect 790 extends through IC cells 780-4 and 780-5 without making electrical contact to any device in these cells; that is, these cells 780-4 and 780-5 merely provide a track through which intercell metal interconnect 790 extends for effectuating the electrical connection between metal pins of other IC cells in the same row. For example, the intercell metal interconnect 790 is configured to route a data signal between the metal pins 780-3 and 780-6. Also note that IC cells 750-1, 750-2, and 750-7 have unused M1 reserved routing tracks, as they are not needed in this example. These unused upper M1 reserved routing tracks are longitudinally (horizontally) aligned with the intercell metal interconnect 790.

Figure 8:
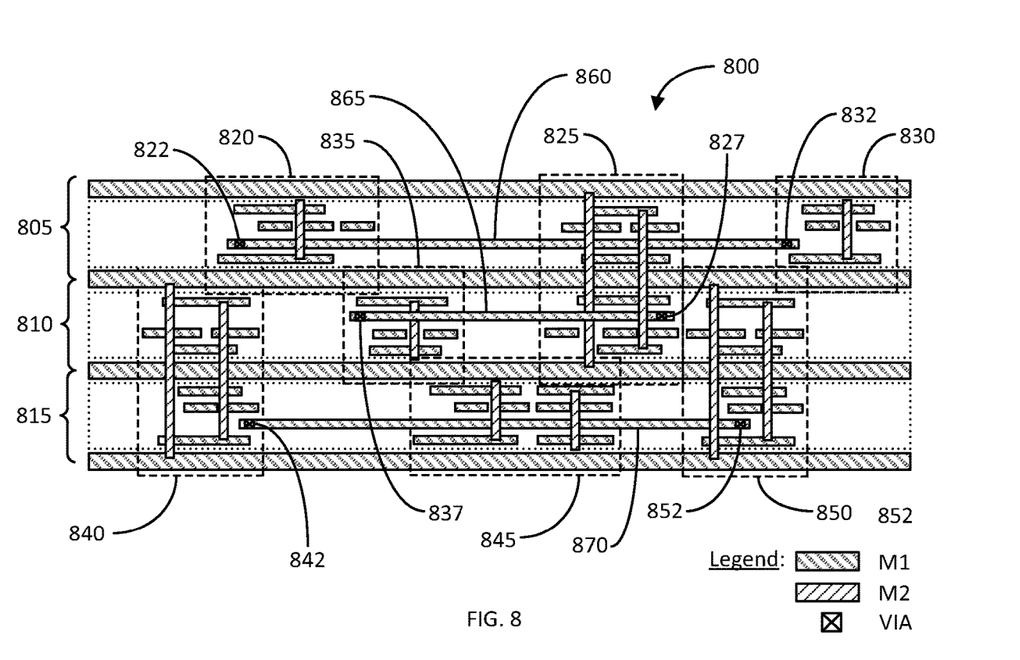
FIG. 8 illustrates a top view of another exemplary integrated circuit (IC) including three-rows of IC cells in accordance with another aspect of the disclosure.

FIG. 8 illustrates a top view of another exemplary integrated circuit (IC) 800 including three-rows of IC cells in accordance with another aspect of the disclosure. In the previous example, IC 700 included the first row of cells 710 with only single-height cells 710-1 to 710-5, and the second row 740 with only double-height cells 750-1 to 750-7. However, it shall be understood that an IC may include rows with a mix of single- and double-height cells. The IC 800 is an example of such IC.

In particular, the IC 800 may be partitioned into first, second, and third single-height rows 805, 810, and 815, respectively. The IC 800 includes two (2) single-height IC cells 820 and 830 in the first row 805. The IC 800 further includes a double-height IC cell 825 extending across the first and second rows 805 and 810. The IC 800 also includes a single-height IC cell 835 in the second row 810. Additionally, the IC 800 includes two (2) double-height IC cells 840 and 850 extending across the second and third rows 810 and 815. Finally, in this example, the IC 800 includes a single-height IC cell 845 in the third row 815.

Regarding M1 intercell metal interconnects, the IC 800 includes an intercell metal interconnect 860 electrically connecting metal pin or I/O node 822 of IC cell 820 to metal pin or I/O node 832 of IC cell 830 entirely via M1 metal layer and an upper reserved M1 metal track of IC cell 825. The intercell metal interconnect 860 is configured to route a data signal between the metal pins 822 and 832. The IC 800 includes another intercell metal interconnect 865 electrically connecting metal pin or I/O node 837 of IC cell 835 to metal pin or I/O node 827 of IC cell 825 entirely via M1 metal layer. The intercell metal interconnect 865 is configured to route a data signal between the metal pins 837 and 837. Additionally, the IC 800 includes another intercell metal interconnect 870 electrically connecting metal pin or I/O node 842 of IC cell 840 to metal pin or I/O node 852 of IC cell 850 entirely via M1 metal layer and a reserved M1 metal track of IC cell 845. The intercell metal interconnect 870 is configured to route a data signal between the metal pins 842 and 852.

Figure 9:
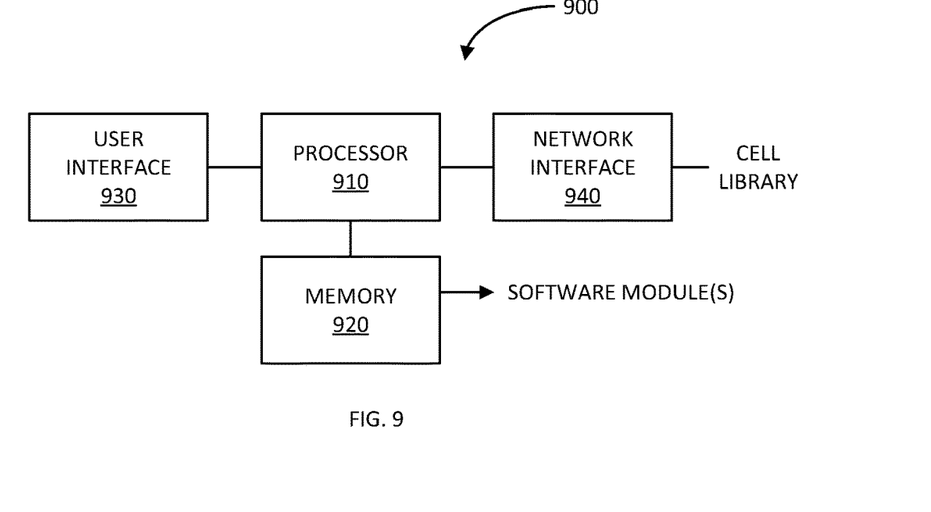
FIG. 9 illustrates a block diagram of an exemplary system for designing integrated circuits (ICs) in accordance with another aspect of the disclosure.

FIG. 9 illustrates a block diagram of an exemplary system 900 for designing integrated circuits (ICs) in accordance with another aspect of the disclosure. The system 900 may be a processor-based system. For example, the system 900 includes a processor 910 (e.g., a microprocessor), a memory 920 (e.g., random access memory (RAM), read only memory (ROM), cache memory, magnetic hard disk, solid state memory, etc. or any combination thereof) coupled to the processor 910, a user interface 930 (e.g., a display, touchscreen display, speakers, keyboard, pointing device, such as a mouse, printer, etc. or any combination thereof) coupled to the processor 920, and a network interface 940 (e.g., local area network (LAN) interface, wide area network (WAN) interface, WiFi, Ethernet, cellular cell phone, etc., or any combination thereof) coupled to the processor 920.

Under the control of a user via the user interface 930, the processor 920 may access one or more software modules configured to facilitate the design of an integrated circuit (IC). For example, the processor 920 may be configured to design or form one or more IC cells, instantiate the IC cells and place them to form a row or a two-dimensional array of IC cells, and route intercell metal interconnects to electrically connect nodes of the IC cells. The processor 920 may store the one or more IC cells and the IC design in electronic files in a cell library accessible via the network interface 940. An example of a particular IC design method flow is discussed below.

Figure 10:
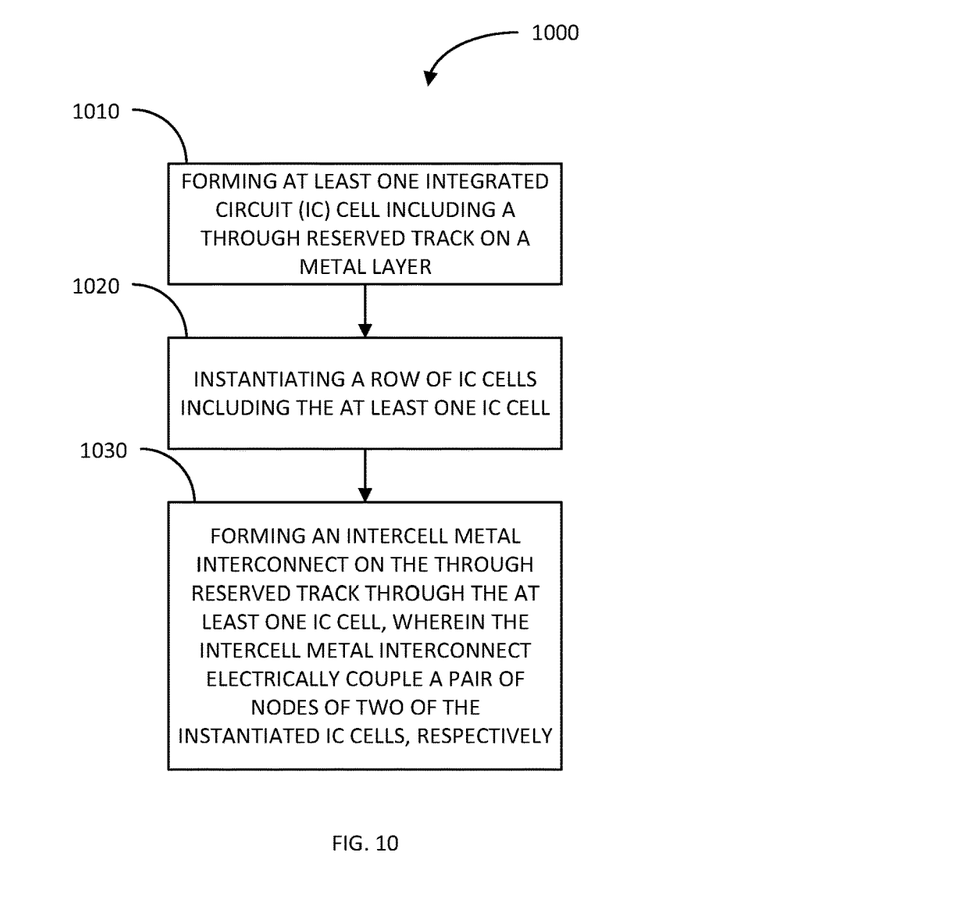
FIG. 10 illustrates a flow diagram of an exemplary method of designing an integrated circuit (IC) in accordance with another aspect of the disclosure.

FIG. 10 illustrates a flow diagram of an exemplary method 1000 of designing an integrated circuit (IC) in accordance with another aspect of the disclosure. The method 1000 includes forming at least one integrated circuit (IC) cell including a through reserved track on a metal layer (block 1010). Examples of such at least one IC cell include IC 300 and IC cell 500, previously discussed in detail.

The method 1000 further includes instantiating a row of IC cells including the at least one IC cell (block 1020). Examples of such row of IC cells including the at least one IC cell include the row of cells 600, 710, 740, 805, 810, and 815, previously discussed in detail.

The method 1000 further includes forming an intercell metal interconnect on the through reserved track through the at least one IC cell, wherein the intercell metal interconnect electrically couple a pair of nodes of two of the instantiated IC cells, respectively (block 1030). Examples of the intercell metal interconnect include intercell metal interconnects 630, 650, 730, 770, 790, 860, 865, and 870.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An integrated circuit, comprising:
a first IC cell arranged in a first row of IC cells including a first pair of IC cells between which the first IC cell is situated, wherein the IC cells in the first row have substantially the same height, wherein the first IC cell comprises a first portion of a first intercell metal interconnect extending through the first IC cell entirely on the first metal layer and electrically connecting together a first pair of nodes of the first pair of IC cells in the first row, respectively.

2. The integrated circuit of claim 1, wherein the routing channel has substantially a same height across the first row.

3. The integrated circuit of claim 1, further comprising one or more other IC cells situated in the first row between the first pair of IC cells, wherein at least one of the one or more other IC cells includes one or more other portions of the first intercell metal interconnect, respectively.

4. The integrated circuit of claim 1, wherein the first intercell metal interconnect extends entirely in a straight line.

5. The integrated circuit of claim 4, further comprising one or more other IC cells situated in the first row but not between the first pair of IC cells, wherein at least one of the one or more other IC cells includes an unused track in the first metal layer and longitudinally aligned with the first intercell metal interconnect.

6. The integrated circuit of claim 1, wherein the first IC cell further includes a second portion of a second intercell metal interconnect terminating at the first IC cell on the first or second metal layer or extending through the first IC cell entirely on the first or the second metal layer and electrically connecting a second pair of nodes of at least one of the first pair of IC cells or at least one of a second pair of IC cells situated in the first row.

7. The integrated circuit of claim 1, further comprising a pair of power metallization rails electrically coupled to the first IC cell, and the first pair of IC cells.

8. The integrated circuit of claim 1, further comprising:
a second IC cell arranged in a second row of IC cells, wherein the second IC cell comprises a second portion of a second intercell metal interconnect terminating at the second IC cell on the first or a second metal layer or extending through the second IC entirely on the first metal layer or the second metal layer and electrically connecting together a second pair of nodes of the second pair of IC cells, respectively.

9. The integrated circuit of claim 8, wherein the height of the first IC cell and the first pair of IC cells in the first row is different than a height of the second IC cell and the second pair of IC cells in the second row.

10. The integrated circuit of claim 1, wherein the first IC cell and the first pair of IC cells include power metallization rails longitudinally aligned and electrically connected to each other.

11. The integrated circuit of claim 10, wherein the power metallization rails supply power to the at least one device of the first IC cell.

12. The integrated circuit of claim 1, wherein the first IC cell and the first pair of IC cells include active or diffusion regions which are connected to each other to form a continuous active or diffusion region.

13. The integrated circuit of claim 12, wherein the at least one device of the first IC cell is formed within and upon the continuous active or diffusion region.

14. An integrated circuit, comprising:
a first IC cell arranged in a first row with and between a first pair of IC cells, wherein the first IC cell and the first pair of IC cells have a first height, wherein the first IC cell comprises a first portion of a first intercell metal interconnect extending along a first routing channel entirely on a first metal layer and electrically connecting together a first pair of nodes of the first pair of IC cells, respectively; and
a second IC cell arranged in a second row with and between a second pair of IC cells, wherein the second IC cell and the second pair of IC cells have a second height, wherein the second IC cell comprises a second portion of a second intercell metal interconnect extending along a second routing channel entirely on the first metal layer or a second metal layer and electrically connecting together a second pair of nodes of the second pair of IC cells, respectively.

15. The integrated circuit of claim 14, wherein a local interconnect is situated between the first metal layer and a substrate.

16. The integrated circuit of claim 14, wherein the first metal layer is between a silicon substrate and the second metal layer.

17. The integrated circuit of claim 14, further comprising a first set of one or more other IC cells situated in the first row between the first pair of IC cells, wherein at least one of the first set of one or more other IC cells includes one or more other portions of the first intercell metal interconnect, respectively.

18. The integrated circuit of claim 17, further comprising a second set of one or more other IC cells situated in the second row between the second pair of IC cells, wherein at least one of the second set of one or more other IC cells includes one or more other portions of the second intercell metal interconnect, respectively.

19. The integrated circuit of claim 14, further comprising a first set of one or more other IC cells situated in the first row but not between the first pair of IC cells, wherein at least one of the first set of one or more other IC cells includes an unused track in the first metal layer and longitudinally aligned with the first intercell metal interconnect.

20. The integrated circuit of claim 19, further comprising a second set of one or more other IC cells situated in the second row but not between the second pair of IC cells, wherein at least one of the second set of one or more other IC cells includes an unused track in the first or second metal layer and longitudinally aligned with the second intercell metal interconnect.

21. The integrated circuit of claim 14, wherein the first IC cell further includes a third portion of a third intercell metal interconnect extending entirely on the first or second metal layer and electrically connecting a third pair of nodes of at least one of the first pair of IC cells or at least one of a third pair of IC cells situated in the first row.

22. The integrated circuit of claim 21, wherein the second IC cell further includes a fourth portion of a fourth intercell metal interconnect extending entirely on the first or second metal layer and electrically connecting a fourth pair of nodes of at least one of the second pair of IC cells or at least one of a fourth pair of IC cells situated in the second row.

23. An integrated circuit, comprising:
 a set of rows of IC cells, wherein at least one IC cell in at least one row comprises a portion of an intercell metal interconnect extending along a routing channel entirely on a metal layer M1 or M2 and electrically connecting together a pair of nodes of a pair of IC cells between which the at least one IC cell is situated in the same row, respectively.

24. The integrated circuit of claim 23, wherein a height of the IC cells in one of the set of rows is different than a height of the IC cells in another of the set of rows.

25. A first integrated circuit (IC) cell, comprising:
 a routing channel including an intercell metal interconnect on a metal layer M1 or a metal layer M2 for routing an input signal or an output signal between second and third IC cells through a first IC cell located between the second and third IC cells, wherein the first, second and third IC cells are at least partially in a same row.

\* \* \* \* \*